United States Patent [19]
Kubota et al.

[11] Patent Number: 5,952,854
[45] Date of Patent: Sep. 14, 1999

[54] SAMPLING CIRCUIT AND IMAGE DISPLAY DEVICE

[75] Inventors: Yasushi Kubota, Sakurai; Ichiro Shiraki; Tamotsu Sakai, both of Tenri, all of Japan

[73] Assignee: Sharp Kabushiki Kaisha, Osaka, Japan

[21] Appl. No.: 08/708,503

[22] Filed: Sep. 5, 1996

[30] Foreign Application Priority Data

Sep. 8, 1995 [JP] Japan ..................................... 7-231777
Jul. 23, 1996 [JP] Japan ..................................... 8-193748

[51] Int. Cl.$^6$ ............................ G11C 27/02; H03K 17/00
[52] U.S. Cl. ................................................. 327/91; 327/94
[58] Field of Search ............................... 327/91, 94, 39.1

[56] References Cited

U.S. PATENT DOCUMENTS

| | | | |
|---|---|---|---|
| 4,611,135 | 9/1986 | Nakayama et al. | 307/572 |
| 4,973,975 | 11/1990 | Yamazaki et al. | 341/122 |
| 5,084,634 | 1/1992 | Gorecki | 307/352 |
| 5,111,072 | 5/1992 | Seidel | 307/353 |
| 5,120,996 | 6/1992 | Mead et al. | 307/353 |
| 5,187,390 | 2/1993 | Scott, III | 307/353 |
| 5,250,852 | 10/1993 | Ovens et al. | 307/272.2 |
| 5,384,496 | 1/1995 | Tanaka | 327/94 |
| 5,572,154 | 11/1996 | Rakers et al. | 327/92 |

OTHER PUBLICATIONS

A.G. Lewis et al., "Driver Circuits for AMLCDs", *International Display Research Conference*, pp. 56–63, 1994.

*Primary Examiner*—Kenneth B. Wells
*Assistant Examiner*—An T. Luu

[57] ABSTRACT

A sampling circuit for sampling an analog signal in accordance with a timing signal includes a sampling switching element having a CMOS configuration. The sampling switching element includes an n-channel transistor and a p-channel transistor connected in parallel. The drive power and the feedthrough voltage are substantially the same in the n-channel transistor and the p-channel transistor. The sampling circuit, for example, is continued with an image display device.

12 Claims, 14 Drawing Sheets

SAMPLING CIRCUIT AND IMAGE DISPLAY DEVICE

BACKGROUND OF THE INVENTION

1. Field of the Invention

The present invention relates to a sampling circuit for an analog signal and an image display device using the sampling circuit.

2. Description of the Related Art

Conventionally, sampling circuits for an analog signal have been utilized in various fields, and their circuits have been specifically designed for the different fields. Hereinbelow, circuitry for a data line drive circuit of a liquid crystal display device used as an image display device are specifically described. Naturally, these circuits are applicable, not only to liquid crystal display devices, but also to other fields.

A liquid crystal display device of an active matrix drive method is conventionally known. As shown in FIG. 11A, such an active matrix liquid crystal display device includes an array of pixels PIX, a scan signal line drive circuit GD, and a data signal line drive circuit SD. A number of scan signal lines GL and a number of data signal lines SL run perpendicular to each other across the pixel array. Pixels PIX are formed in a matrix, each being defined by two adjacent scan signal lines GL and two adjacent data signal lines SL. The data signal line drive circuit SD samples a video signal DAT input thereinto in synchronization with a timing signal such as a clock signal CKS and, after amplifying as required, writes the sampled video signal in the data signal lines SL. The scan signal line drive circuit GD sequentially selects the scan signal lines GL in synchronization with a timing signal such as a clock signal CKG, so as to control the open/close of a switching element of each pixel PIX, thus allowing the video signal (data) written in each data signal line SL to be supplied to a pixel electrode of each pixel PIX or data already written in each pixel PIX to be retained.

As shown in FIG. 11B, each pixel PIX includes a field effect transistor SW as the switching element and a pixel capacitance (composed of a liquid crystal capacitance $C_L$ and, as required, a storage capacitance $C_S$). A data signal line $SL_i$ is connected to one electrode of the pixel capacitance via a drain and a source of the transistor SW. A scan signal line $GL_j$ is connected to a gate of the transistor SW. The other electrode of the pixel capacitance is connected to a common electrode line shared by all pixels. The transmittance or reflectance of the liquid crystal layer is modulated with a display voltage applied to the liquid crystal capacitance $C_L$ of each pixel capacitance, thus realizing image display.

In conventional active matrix liquid crystal display devices, an amorphous silicon thin film formed on a transparent substrate is used as a semiconductor layer of each transistor SW, and the scan signal line drive circuit GD and the data signal line drive circuit SD are formed as individual external ICs.

In recent years, however, in response to the requests for increase in the drive power of transistors for pixel display, reduction in the cost for mounting driver ICs, improvement in the reliability at the mounting, and the like which have arisen with the recent trend of enlarging the display screen size, techniques for monolithically forming a pixel array and drive circuits on a substrate using a polysilicon thin film have been reported. Furthermore, for further enlarging the display screen size and reducing the cost, there have been attempts to form these elements using a polysilicon thin film on a glass substrate at a process temperature below a glass strain point (about 600° C.). Such polysilicon thin film transistors (TFTs), however, have inferior device characteristics compared with transistors formed on a single crystalline silicon substrate. For example, the polysilicon TFTs have a large size and a small carrier mobility. In other words, in order to obtain drive power of the same magnitude, polysilicon TFTs with a larger size (channel width) are required, compared with the case of using single crystalline silicon.

Hereinbelow, how image data is written to the data signal lines will be described. The data signal lines are driven by two methods: a point-at-a-time drive method and a line-at-a-time drive method.

First, the point-at-a-time drive method will be described with reference to FIG. 6. A video signal input into a video signal line DAT is written to the data signal lines SL depending on the open/closed state of corresponding sampling switches SWT conducted in synchronization with an output pulse from corresponding stage shift registers SR as scan circuits which receive the clock signal CKS and a start signal SPS. In this procedure, each buffer circuit LAT receives the signal from the corresponding shift register SR, retains and amplifies the signal, and produces an inverted signal as required. In this method, the period available for writing the video signal in each data signal line SL is only 1/(total number of data signal lines) of an effective horizontal scan period (about 80% of a horizontal scan period). Accordingly, the signal may not be sufficiently written in the data signal line when the time constant (product of capacitance and resistance) of the data signal line increases with the enlargement of the display screen size and/or when the sampling time is shortened with the improvement in precision. This degrades display quality. This is particularly true when the sampling switches SWT are composed of transistors with a small drive power such as the polysilicon TFTs as described above. To overcome this problem, conventionally, the channel width of the transistor constituting the sampling switch SWT is made large to ensure sufficient write performance.

The line-at-a-time drive method will be described with reference to FIG. 7.

A video signal is sampled via sampling switches SWT1 and temporarily stored in sampling capacitors Csmp. When a transfer signal transmitted through a transfer signal line TRF activates transfer switches SWT2, the charges stored in the sampling capacitors are output as data signals to the data signal lines SL via corresponding signal amplifiers AMP during the next horizontal scan period. In general, the sampling capacitor Csmp is smaller than the data signal line SL in capacitance. Accordingly, the above-described problem which occurs in the point-at-a-time drive method is not so significant. However, insufficient writing as in the point-at-a-time drive method may occur if the capacitance of each sampling capacitor Csmp is increased to compensate for a temporal decrease in the amount of charge retained in the sampling capacitor Csmp due to a leak current flowing through the sampling switch SWT1 and a reduction in the amount of charge due to capacitance division at the signal transfer to the signal amplifier AMP. This is especially true as the precision of the display becomes higher. In such a case, also, the channel width of the transistor constituting the sampling switch SWT1 is made large to ensure sufficient write performance. In FIG. 7, the reference code Ch denotes a holding capacitor.

FIG. 12 shows a configuration of a conventional sampling circuit. Referring to FIG. 12, the sampling switch SWT is a complementary metal oxide semiconductor (CMOS) composed of an n-channel transistor NM and a p-channel transistor PM as sampling transistors connected in parallel. In this configuration, the positive level of a video signal is written to the data signal line SL via the n-channel transistor NM, while the negative level of the video signal is written to the data signal line SL via the p-channel transistor PM. A timing signal generated by the shift register SR is supplied to a gate of the n-channel transistor NM or the p-channel transistor PM via a plurality of inverting circuits INV1 to INV4 and some logic circuits (not shown) disposed as required. The inverting circuits INV1 to INV4 are disposed so as to drive the sampling transistors having a large channel width (large input load) with the timing signal from the shift register SR having a small drive power, and to match the phase (polarity) of the timing signal. The inverting circuit at a later stage is composed of a transistor with a larger channel width. The logic circuits allow the video signal to be sampled only in a required minimum amount, and to control the timing of the sampling. Since signals of the reverse phases need to be input into the gates of the n-channel transistor NM and the p-channel transistor PM, an odd number of (normally, one) circuits are additionally disposed on the route to one of the sampling transistors to produce the signals with the reverse phases.

In the above conventional CMOS sampling circuit, the channel length and width of the n-channel transistor NM are substantially the same as those of the p-channel transistor PM as shown in FIG. 12. This configuration is shown, for example, in FIG. 13 (page 61) of "Driver Circuits for AMLCDs", 1994, International Display Research Conference, pp. 56–64.

In the conventional configuration shown in the above figure, however, the write period differs depending on polarity of the video signal. This is mainly because the carrier mobility of the n-channel transistor NM is different from that of the p-channel transistor PM. It is generally known that the carrier mobility of the p-channel transistor PM is smaller than that of the n-channel transistor NM.

In the above case, especially if a sufficient allowance of time is not available for the writing, the positive level of a data signal is different from the negative level thereof. This is likely to cause flickering in a device employing a polarity inversion drive method such as liquid crystal display devices.

In order to avoid this problem, the drive power of the n-channel transistor NM and the p-channel transistor PM should be the same. The simplest way to accomplish this is to set the channel widths W of the sampling transistors in inverse proportion to their carrier nobilities $\mu$. In other words, the value of $\mu \times W$ for the n-channel transistor NM should be the same as that for the p-channel transistor PM. For example, if the carrier mobility of the n-channel transistor NM is twice that of the p-channel transistor PM, the channel width of the n-channel transistor NM should be a half that of the p-channel transistor PM, as shown in FIG. 13. This is possible because, in general, the n-channel transistor NM and the p-channel transistor PM are substantially the same in the channel length, the thickness of the gate insulating film, and the like.

The above solution, however, causes a new problem. That is, as shown in FIGS. 14A and 14B, when the transistor is turned from the ON state to the OFF state, the charge stored in a channel capacitance of the transistor (capacitance between the gate electrode and a channel region) is divided and flows to the source side and the drain side. When the drain side includes a floating node having a predetermined capacitance such as the data signal line, the potential of the floating node fluctuates with the divided charge. Further, the amount of charge stored in the channel capacitance is proportional to the area of the channel region. Accordingly, when the channel width differs between the two sampling transistors as described above, the influence of the potential fluctuation at the data signal line also differs. This refers to the case where the channel lengths of the two transistors are the same.

In the above case, the potential fluctuation at the data signal line occurring when the transistor is turned off is asymmetric between when the sampled signal is positive and when the sampled signal is negative. This is also likely to cause flickering in a device of the polarity inversion drive method such as liquid crystal display devices.

In a data signal line drive circuit having a plurality of sampling circuits, it is possible to eliminate the influence of the potential fluctuation at the data signal line on the image display, as far as the influence is fixed, by adjusting the level of the video signal. However, if the threshold voltage and the like vary among the plurality of sampling circuits, the potential fluctuation at the data signal line varies, resulting in degradation of the display image (vertical stripes, etc.).

In particular, the sampling circuit composed of polysilicon TFTs tends to be largely influenced by the potential fluctuation because a larger channel width is required as described above. Therefore, it is important to reduce the channel area as much as possible.

SUMMARY OF THE INVENTION

A sampling circuit of the present invention for sampling an analog signal in accordance with a timing signal includes a sampling switching element having a CMOS configuration. The sampling switching element includes an n-channel transistor and a p-channel transistor connected in parallel, wherein a drive power and a feedthrough voltage are substantially the same in the n-channel transistor and the p-channel transistor.

According to another aspect of the invention, a sampling circuit for sampling an analog signal in accordance with a timing signal includes a sampling switching element having a CMOS configuration. The sampling switching element includes an n-channel transistor and a p-channel transistor connected in parallel, wherein values of $\mu \times W/L$ and $W \times L$ of the n-channel transistor are substantially equal to those of the p-channel transistor, where $\mu$, W and L are mobility, a channel width and a channel length, respectively.

According to still another aspect of the invention, a sampling circuit for sampling an analog signal in accordance with a timing signal includes a sampling switching element having a CMOS configuration. The sampling switching element includes an n-channel transistor and a p-channel transistor connected in parallel, wherein a channel length of the p-channel transistor is smaller than that of the n-channel transistor, and the product of the channel length and a channel width of the p-channel transistor is substantially equal to that of the n-channel transistor.

In one embodiment of the invention, each of the n-channel transistor and the p-channel transistor includes a polysilicon thin film transistor.

An image display device of the present invention includes: an array of pixels arranged in matrix; data signal lines each disposed adjacent to a corresponding column of the pixels, each of the data signal lines supplying data signals to the pixels of the corresponding column; a data signal drive circuit for sampling a video signal in accordance with a timing signal and writing the sampled video signal as the data signals in the data signal lines, the data signal drive circuit including a sampling circuit. The sampling circuit includes a sampling switching element having a CMOS configuration. The sampling switching element includes an n-channel transistor and a p-channel transistor connected in parallel. A drive power and a feedthrough voltage of the n-channel transistor are substantially the same as those of the p-channel transistor.

According to another aspect of the invention, an image display device includes: an array of pixels arranged in a matrix; data signal lines each disposed adjacent to a corresponding column of the pixels, each of the data signal lines supplying data signals to the pixels of the corresponding column; a data signal drive circuit for sampling a video signal in accordance with a timing signal and writing the sampled video signal as the data signals in the data signal lines, the data signal drive circuit including a sampling circuit. The sampling circuit includes a sampling switching element having a CMOS configuration. The sampling switching element includes an n-channel transistor and a p-channel transistor connected in parallel, values of $\mu \times W/L$ and $W \times L$ of the n-channel transistor being substantially equal to those of the p-channel transistor, where $\mu$, W and L are mobility, a channel width and a channel length, respectively.

According to still another aspect of the invention, an image display device includes: an array of pixels arranged in a matrix; data signal lines each disposed adjacent to a corresponding column of the pixels, each of the data signal lines supplying data signals to the pixels of the corresponding column; a data signal drive circuit for sampling a video signal in accordance with a timing signal and writing the sampled video signal as the data signals in the data signal lines, the data signal drive circuit including a sampling circuit. The sampling circuit includes a sampling switching element having a CMOS configuration. The sampling switching element includes an n-channel transistor and a p-channel transistor connected in parallel, a channel length of the p-channel transistor being smaller than that of the n-channel transistor, and the product of the channel length and a channel width of the p-channel transistor being substantially equal to that of the n-channel transistor.

In one embodiment of the invention, polysilicon thin film transistors are provided in the array of pixels for connecting the data signal lines to the pixels of the respective columns, and at least the array of pixels and the data signal drive circuit are formed on an insulating substrate.

Thus, according to the present invention, the n-channel transistor and the p-channel transistor which are connected in parallel to constitute the sampling circuit are provided with substantially the same drive power. Also, the feedthrough voltages caused by the channel capacitances of the n-channel transistor and the p-channel transistor are made substantially the same. With these settings, the positive and negative levels of the output of the sampling circuit at the completion of data writing can be symmetric about a zero level.

In the sampling circuit, the drive power and the feedthrough voltages caused by the channel capacitances of the n-channel transistor and the p-channel transistor can be easily made substantially the same by setting the values of $\mu \times W/L$ ($\mu$: mobility, W: channel width, L: channel length) and the values of $W \times L$ of the two transistors to be substantially equal.

Alternatively, in the sampling circuit of the present invention, the product of the channel length and the channel width is substantially the same between the n-channel transistor and the p-channel transistor constituting a CMOS. Accordingly, the feedthrough voltages caused by the channel capacitances of the two transistors are substantially the same. As a result, the positive and negative levels of the output of the sampling circuit at the completion of data writing can be made symmetric. Furthermore, in general, the breakdown voltage of the p-channel transistor is higher than that of the n-channel transistor if the two transistors have the same channel length. Accordingly, the channel area can be reduced while maintaining the same level of drive power by making the channel length of the p-channel transistor smaller than that of the n-channel transistor. As a result, in a system including a plurality of sampling circuits, the variation in the feedthrough voltage caused by the variation in the threshold voltage can be reduced, improving the uniformity of the sampling voltage.

When a polysilicon TFT is used as a sampling switch constituting the sampling circuit, the transistor and channel capacitance are large in size because the carrier mobility is low and the processing precision is low, compared with the case of a single crystalline silicon transistor. Thus, the transistor of the sampling circuit tends to be largely influenced by the feedthrough voltage. The use of the sampling circuit of the present invention can eliminate or greatly reduce the adverse effect of the feedthrough voltage of the transistors constituting the sampling circuit. As a result, a high quality image can be obtained.

When the sampling circuit of the present invention is used in the data signal line drive circuit for writing a video signal in the data signal lines, the positive and negative levels of the written signal are symmetric for display by the polarity inversion drive method, for example. As a result, a high quality image display without flickering can be realized.

When the image display device is fabricated by forming at least the pixels and the data signal line drive circuit integrally on an insulating substrate using a polysilicon thin film formed on the substrate, the cost for mounting the drive circuits can be reduced, while realizing a high quality image display.

In the image display device of the present invention, the above-mentioned sampling circuit is used in the data signal line drive circuit for writing a video signal in the data signal line. Accordingly, the positive and negative levels of the signal are symmetric in the display by the polarity inversion drive method. The variation in the feedthrough voltage caused by the variation in the device characteristics is minimized, and thus a high quality image display with no flicker can be realized.

In the image display device of the present invention, at least the pixels and the data signal line drive circuit are integrally formed on an insulating substrate using a polysilicon thin film formed on the substrate. This makes it possible to reduce the cost for mounting the drive circuits, as well as realizing a high quality image display.

Thus, the invention described herein makes possible the advantages of (1) providing a sampling circuit capable of displaying high quality images without flickering by making the positive level and the negative level of the output from the sampling circuit symmetric, (2) providing a sampling circuit capable of displaying images without vertical stripes irrespective of a variation in potential fluctuation in addition to displaying high quality images without flickering by making the positive level and the negative level of the output of the sampling circuit symmetric, and (3) providing an image display device using such a sampling circuit.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference to the accompanying drawings.

EXAMPLE 1

Figure 1:
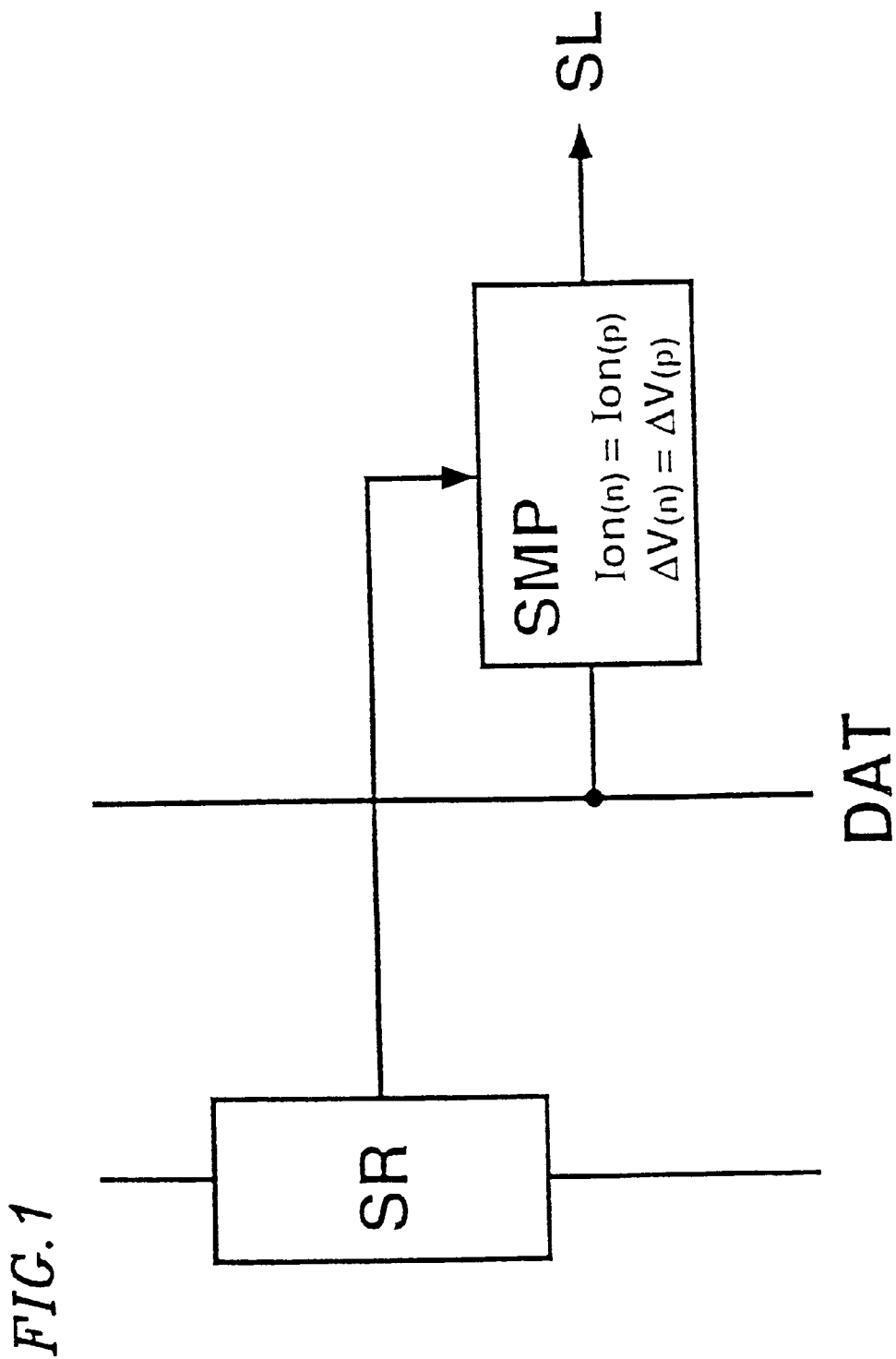
FIG. 1 is a block diagram showing a configuration of a sampling circuit of Example 1 according to the present invention.

FIG. 1 is a block diagram showing a configuration of a sampling circuit of Example 1 according to the present invention.

Referring to FIG. 1, a CMOS type sampling circuit SMP is opened/closed with a timing signal output from a shift register SR as a scanning circuit. Based on the timing signal, the sampling circuit SMP samples an analog video signal supplied from a video signal line DAT. The sampling circuit SMP is a parallel circuit composed of an n-channel transistor and a p-channel transistor, and configured so that the drive power, for example an ON current $I_{on(n)}$, and a feedthrough voltage $\Delta V_{(n)}$ of the n-channel transistor are substantially the same as an ON current $I_{on(p)}$ and a feedthrough voltage $\Delta V_{(p)}$ of the p-channel transistor, respectively. The feedthrough voltages $\Delta V_{(n)}$ and $\Delta V_{(p)}$ of the n-channel and p-channel transistors depend on the amount of charge stored in the channel portion.

Figure 2:
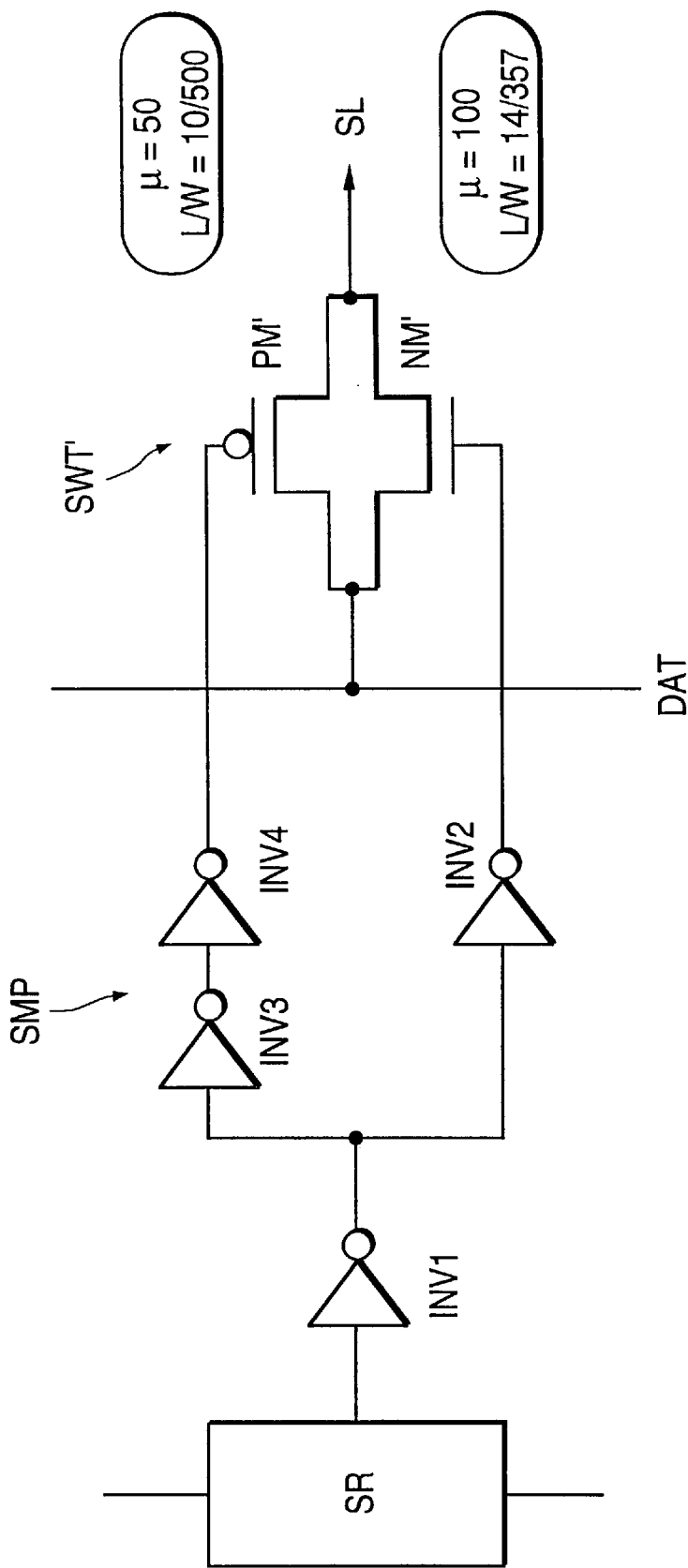
FIG. 2 is a circuit diagram showing a specific configuration of the sampling circuit shown in FIG. 1.

FIG. 2 is a circuit diagram showing a specific configuration of the sampling circuit SMP of FIG. 1.

Referring to FIG. 2, the timing signal output from the shift register SR is first inverted and amplified by an inverting circuit INV1 and then transmitted through two routes. In one route, the signal is supplied to a gate electrode of an n-channel transistor NM' via an inverting circuit INV2. In the other route, the signal is supplied to a gate electrode of a p-channel transistor PM' via inverting circuits INV3 and INV4. The video signal from the video signal line DAT is written in the data signal line SL via a sampling switch SWT' composed of the n-channel transistor NM' and the p-channel transistor PM'.

In order to satisfy the above condition where the drive power and the feedthrough voltage of the n-channel transistor should be substantially the same as those of the p-channel transistor, the channel lengths L of these transistors, not only the channel widths thereof, are appropriately selected. More specifically, the value of $\mu \times W/L$, wherein $\mu$ denotes the carrier mobility, of the n-channel transistor NM' is made substantially the same as that of the p-channel transistor PM', so as to equalize the drive powers of the two sampling transistors. Also, the value of $W \times L$ of the n-channel transistor NM' is made substantially the same as that of the p-channel transistor PM', so as to equalize the feedthrough voltages $\Delta V_{(n)}$ and $\Delta V_{(p)}$ of the two sampling transistors.

As described above, the drive power of each of the two sampling transistors can be substantially the same by setting the values of $\mu \times W/L$ of the two transistors to be substantially equal. As a result, no difference arises between the positive level of a data signal written mainly via the n-channel transistor NM' and the negative level of the data signal written mainly via the p-channel transistor PM'. Thus, excellent display quality without flickering can be obtained even for a device employing the polarity inversion drive method, as in liquid crystal display devices.

Further, as described above, the channel capacitances of the two sampling transistors can be made substantially the same by setting the values of W×L of the two transistors to be substantially equal. When the channel capacitances are substantially the same, the feedthrough voltages caused by the amount of charge stored in the channel capacitance are substantially the same. As a result, the positive and negative levels of the output of the sampling circuit are symmetric at the completion of data writing. Thus, excellent display quality without flickering can be obtained even for a device employing the polarity inversion drive method, as in liquid crystal display devices.

Figure 3:
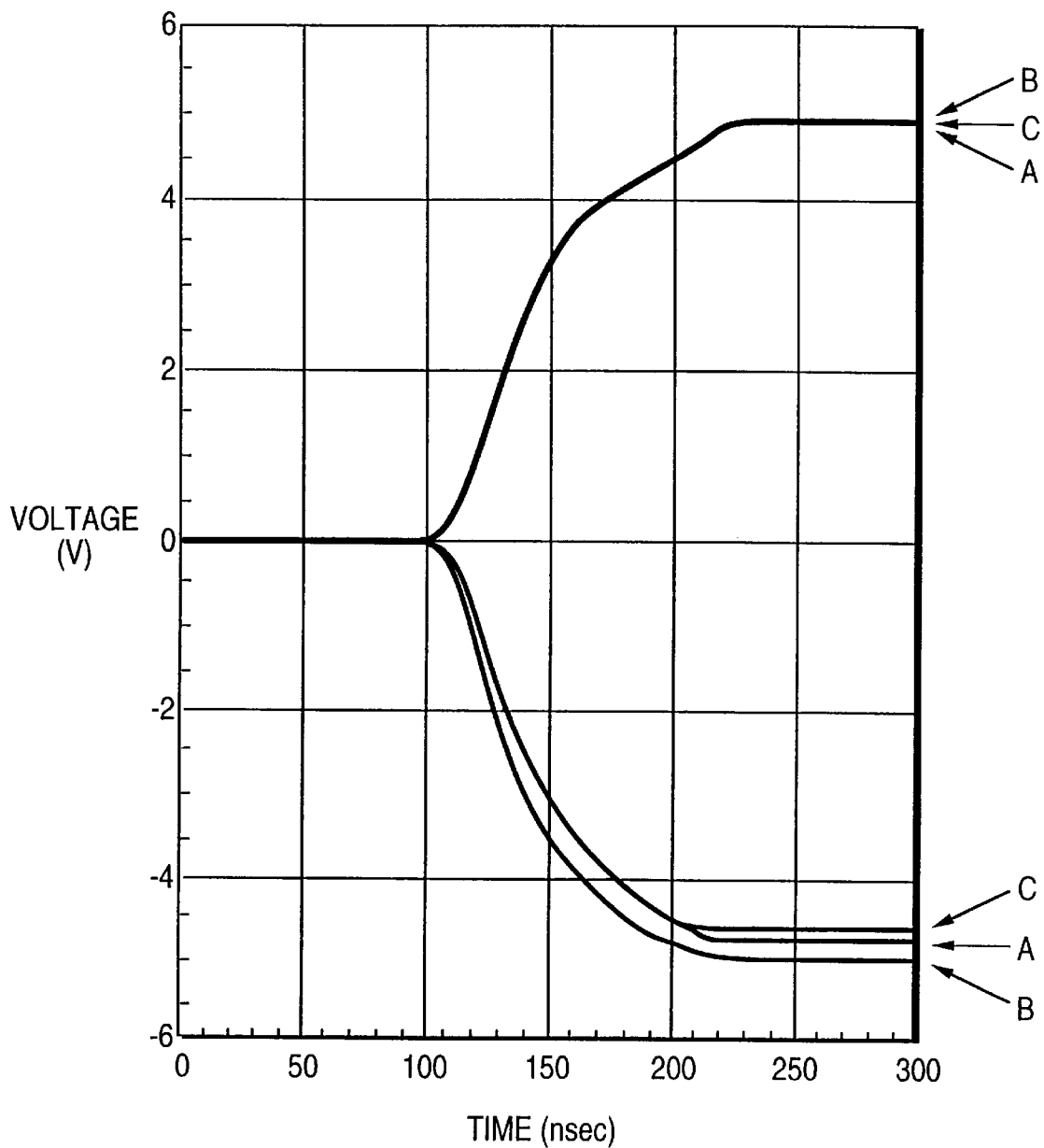
FIG. 3 is an output waveform diagram showing the write characteristics of the sampling circuit of Example 1 and conventional sampling circuits.

A simulation test was conducted to confirm the above-described effect of the present invention. The results are shown in FIG. 3. FIG. 3 shows output waveforms of the sampling circuit SMP of this example shown in FIG. 2 and the two conventional sampling circuits shown in FIGS. 12 and 13 when a video signal (+5 V and −5 V) is sampled.

Figure 12:
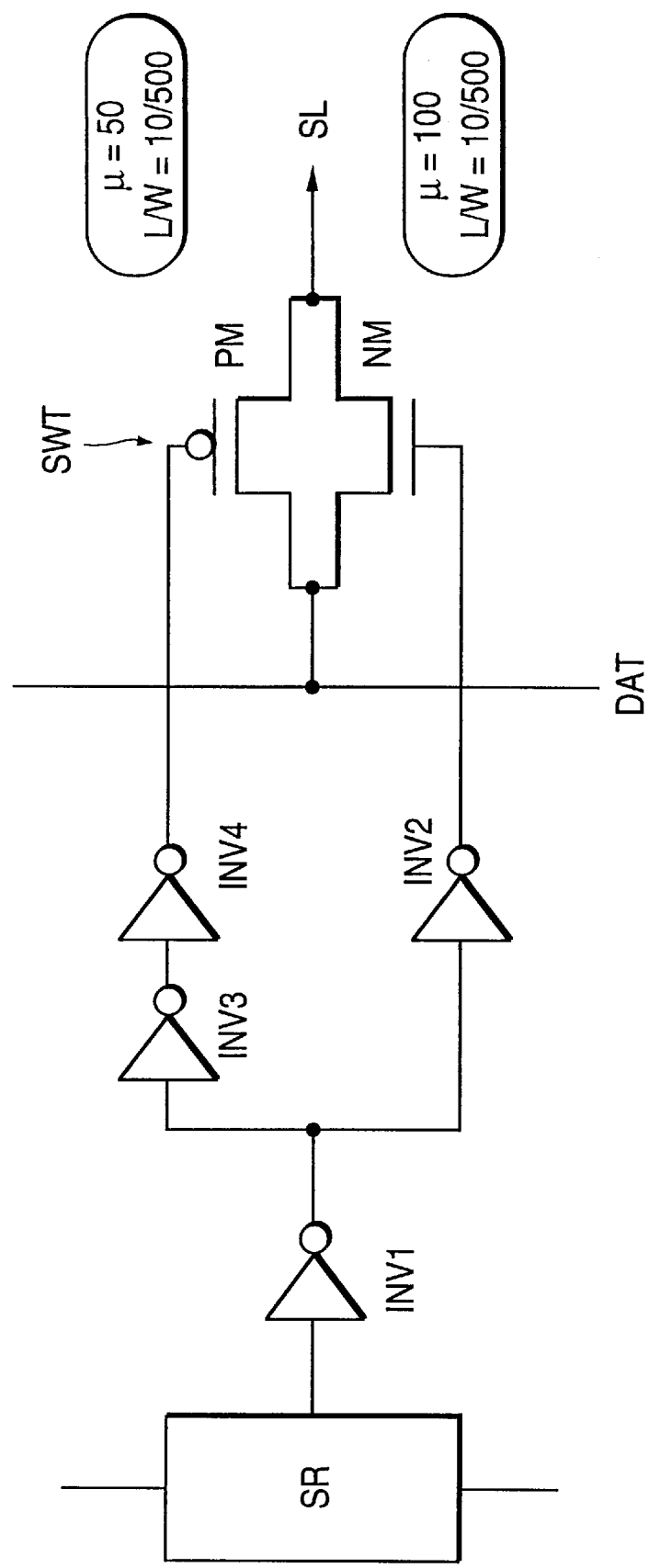
FIG. 12 is a circuit diagram of a conventional sampling circuit.
Figure 13:
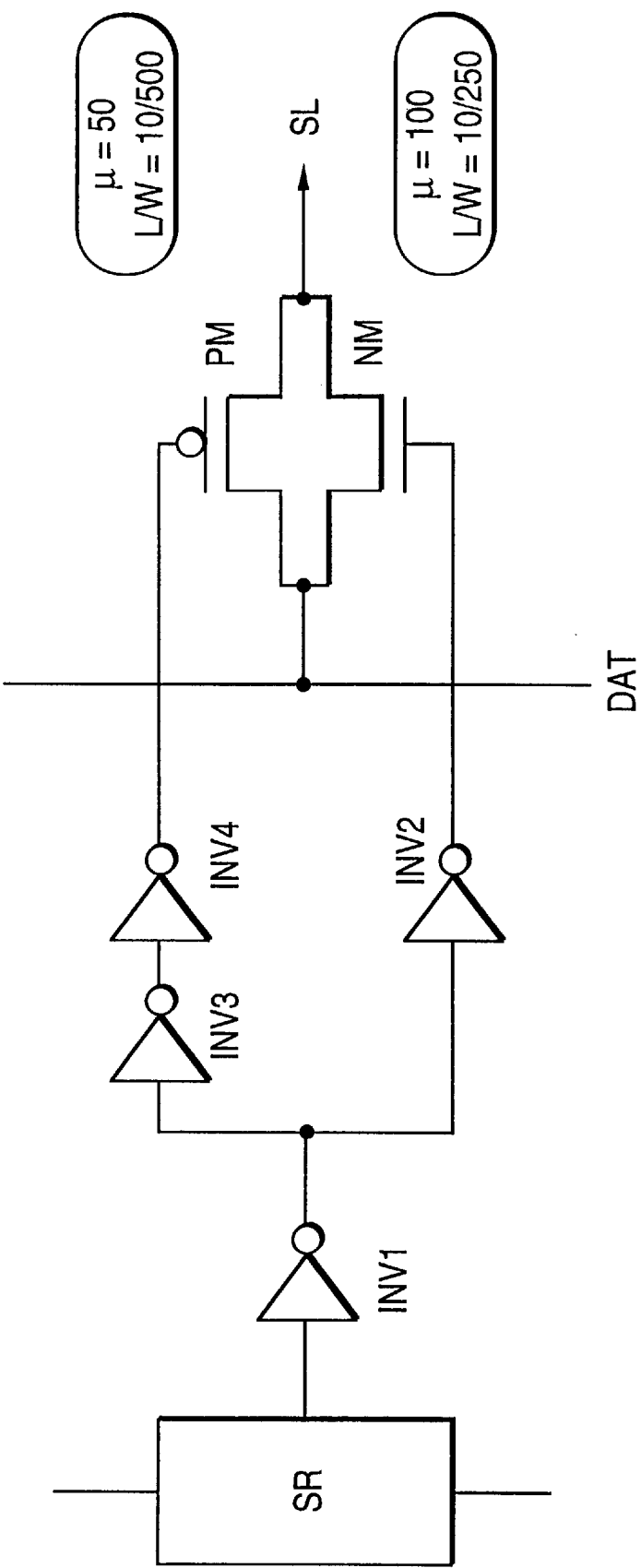
FIG. 13 is a circuit diagram of another conventional sampling circuit.
Figure 14A:
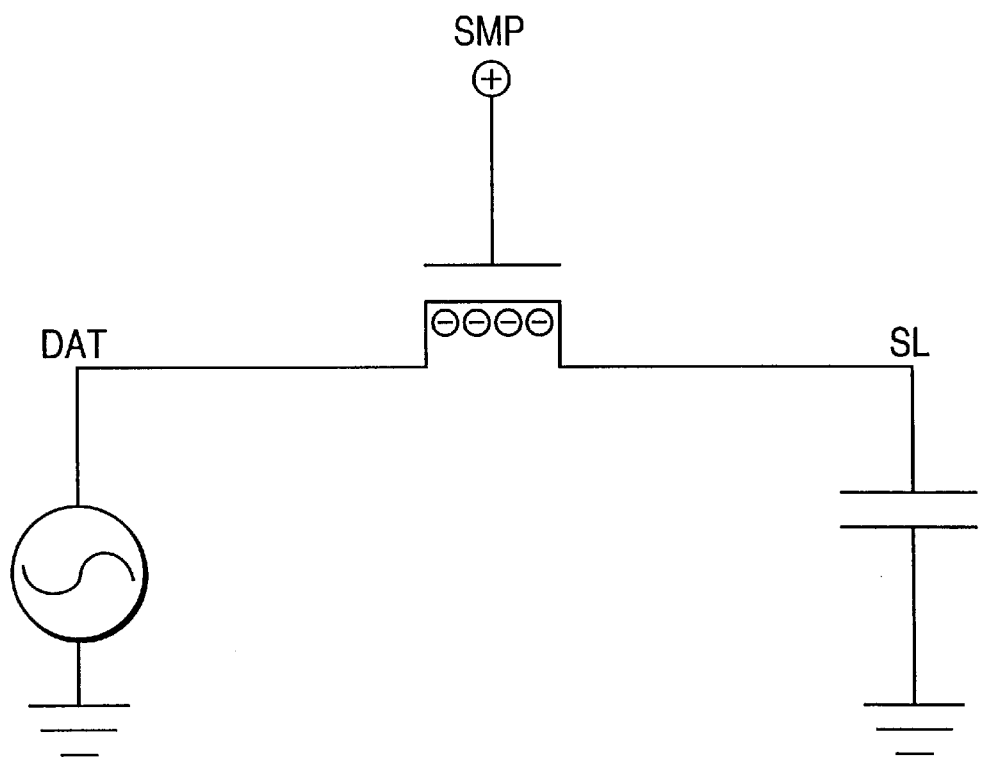
FIGS. 14A and 14B are schematic views illustrating why the problem of potential fluctuation which is solved by the present invention occurs.
Figure 14B:
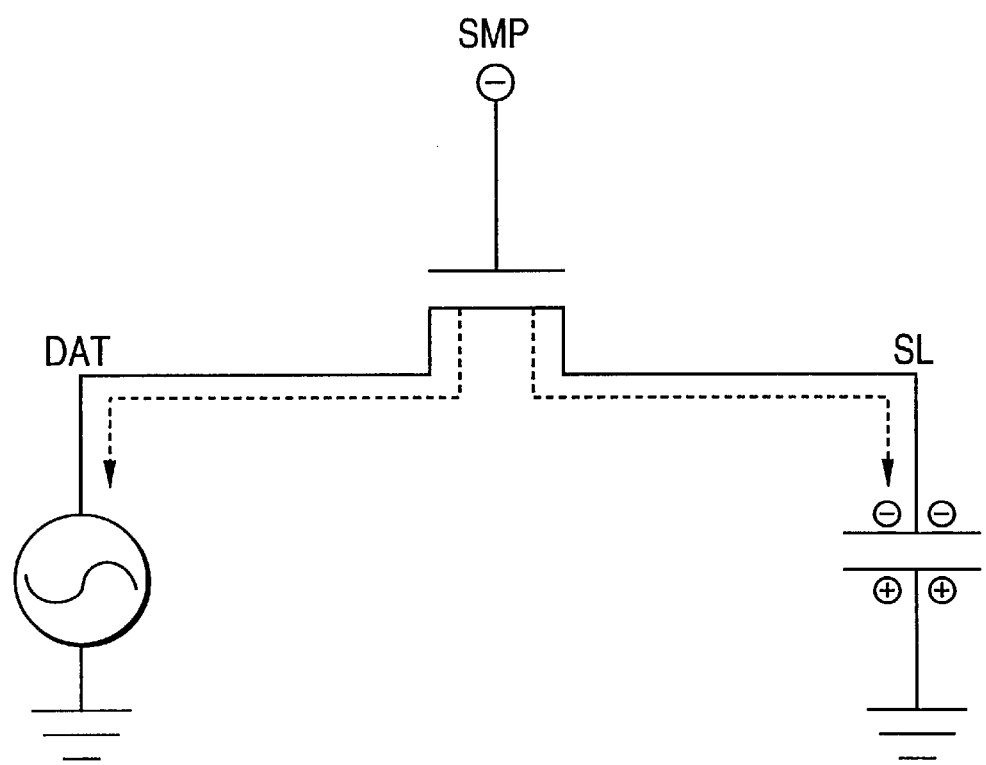

In FIG. 3, output waveforms A, B, and C correspond to the sampling circuit SMP of this example and the conventional sampling circuits shown in FIGS. 12 and 13, respectively. The sampling signal (not shown) is supplied so that each transistor is turned on at a time of 100 nsec and turned off at a time of 200 nsec.

Since the three sampling circuits have the p-channel transistors of the same size and equal mobility, the waveforms of the outputs of the three sampling circuits are substantially the same when the positive level of the video signal is sampled. In contrast, the waveforms of the outputs of these sampling circuits when the negative level of the video signal is sampled are clearly different from one another.

More specifically, as for the output waveform B from the conventional sampling circuit shown in FIG. 12, since the drive power of the n-channel transistor is larger than in the other conventional sampling circuit shown in FIG. 13 and the sampling circuit of this example, writing is faster than in the other sampling circuits. Thus, when the negative level of the video signal is sampled, the level of the written voltage at the completion of the writing in the sampling circuit shown in FIG. 12 is lower than in the other sampling circuits, as shown in FIG. 3. Also, in the sampling circuit shown in FIG. 12, the magnitude of the written voltage at the completion of the writing when the negative level of the video signal is sampled, is larger than that when the positive level of the video signal is sampled. As a result, the waveform B of the written voltage is asymmetric on its positive and negative sides.

As for the output waveform C from the conventional sampling circuit shown in FIG. 13, since the channel capacitance of the n-channel transistor NM is small, the feedthrough voltage (potential fluctuation) at the completion of writing (at the termination of sampling) is smaller than in the other sampling circuits. Thus, the magnitude of the written voltage is smaller when the negative level of the video signal is sampled than that when the positive level of the video signal is sampled. As a result, the waveform of the written voltage is asymmetric on its positive and negative sides.

On the contrary, as for the sampling circuit SMP of this example shown in FIG. 2, the drive power and the channel capacitance of the n-channel transistor NM' are substantially the same as those of the p-channel transistor PM', respectively. Accordingly, the writing rate and the potential fluctuation at the termination of sampling when the positive level of the video signal is sampled and written are substantially the same as those when the negative level of the video signal is sampled and written. As a result, as is shown in FIG. 3, the curve showing the written voltage is substantially symmetric on its positive and negative sides. The effect of the present invention is thus confirmed.

The n-channel transistor NM' and the p-channel transistor PM' are required to write a video signal in the data signal line SL within a predetermined period. A channel width required for this writing is set under the conditions of the thickness of the gate insulating film and the minimum channel length selected based on the manufacturing process. Accordingly, when the carrier mobility of the transistor is small, for example, when a polysilicon TFT is used, the channel width needs to be large. Also, when a production process which is not so sophisticated, such as the polysilicon thin film formation process, is employed, the processed size, i.e., the minimum channel length of the resultant transistor, is relatively large. Such a transistor needs to have a larger channel width to obtain the same drive power.

As the channel width of the transistor is made larger to increase the drive power (write performance) of the sampling circuit as described above, the capacitance of the channel capacitance (proportional to the product of the channel width and the channel length) becomes larger, thereby increasing the potential fluctuation at the data signal line caused by increased charge stored in the channel capacitance. If the channel capacitances of the n-channel transistor NM' and the p-channel transistor PM' are different, the potential fluctuations caused by the two transistors are asymmetric, causing flickering and the like in the display image.

It is therefore expected that a transistor with a small carrier mobility fabricated by a production process which is not so sophisticated, such as the polysilicon TFT, generally experiences problems such as flickering. However, by using the sampling circuit of Example 1, the adverse effect of the increased potential fluctuation can be eliminated or greatly reduced.

Figure 4:
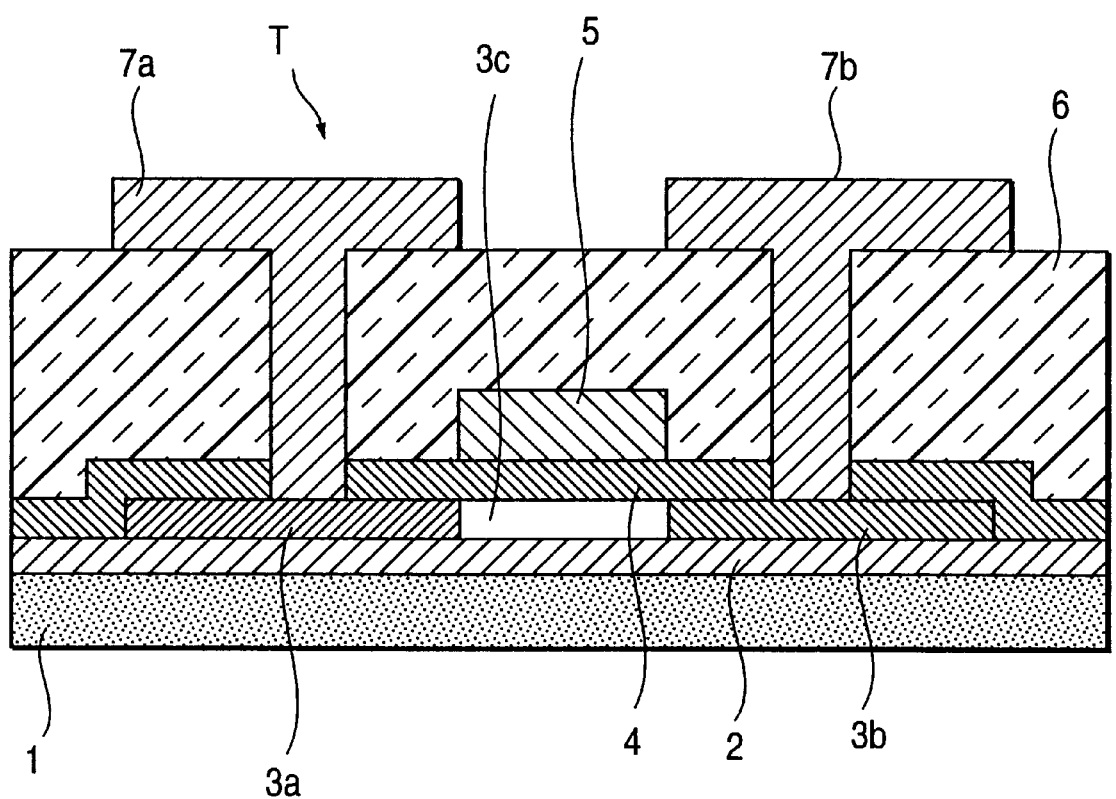
FIG. 4 is a sectional view of a polysilicon TFT as an example of the transistor constituting a sampling switch shown in FIG. 2.

FIG. 4 is a sectional view of a polysilicon TFT T as an example of the transistor constituting the sampling switch SWT' shown in FIG. 2.

Referring to FIG. 4, a silicon oxide film 2 as an anti-pollution film is formed on an insulating substrate 1 made of glass or the like. On the silicon oxide film 2 is formed a polysilicon thin film which is to be a source region 3a, a drain region 3b, and a channel region 3c at a later stage. A gate insulating film 4 is then formed covering the polysilicon thin film, and a gate electrode 5 is formed on the portion of the gate insulating film 4 above the center of the polysilicon thin film. Thereafter, by a self-alignment method using the gate electrode 5 as a mask, impurities are implanted in portions of the polysilicon thin film to define the source region 3a and the drain region 3b. An interlayer insulating film 6 is formed over the resultant substrate. Contact holes are formed through the portions of the interlayer insulating film 6 located above the source region 3a and the drain region 3b, to form metal wirings 7a and 7b connected to the source region 3a and the drain region 3b, respectively. Thus, the polysilicon TFT T is completed. Then, the resultant polysilicon TFT T is hydrogenated, if required, to improve the characteristics of the transistor.

The polysilicon TFT T may be used as the n-channel transistor and the p-channel transistor of the sampling switch SWT' of this example. Such polysilicon n-channel and p-channel transistors are arranged in parallel and configured so that the drive power and the feedthrough voltage of the two transistors are substantially the same. With this configuration, the magnitude of the output of the sampling switch when the positive level of the signal is sampled can be equal to that when the negative level of the signal is sampled. Thus, a sampling circuit capable of displaying high quality images can be obtained.

EXAMPLE 2

Figure 5:
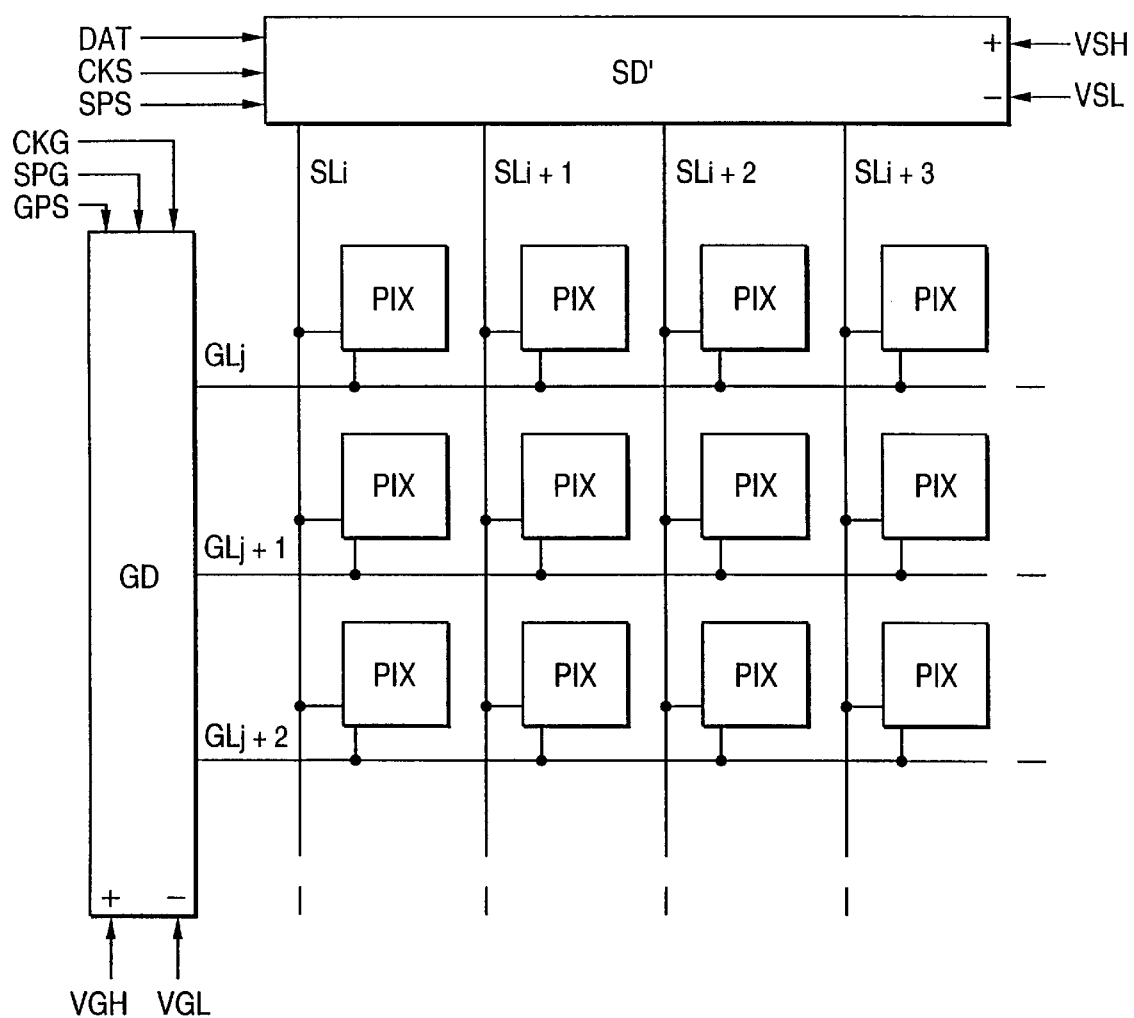
FIG. 5 is a block diagram showing a configuration of an image display device of Example 2 according to the present invention.
Figure 11A:
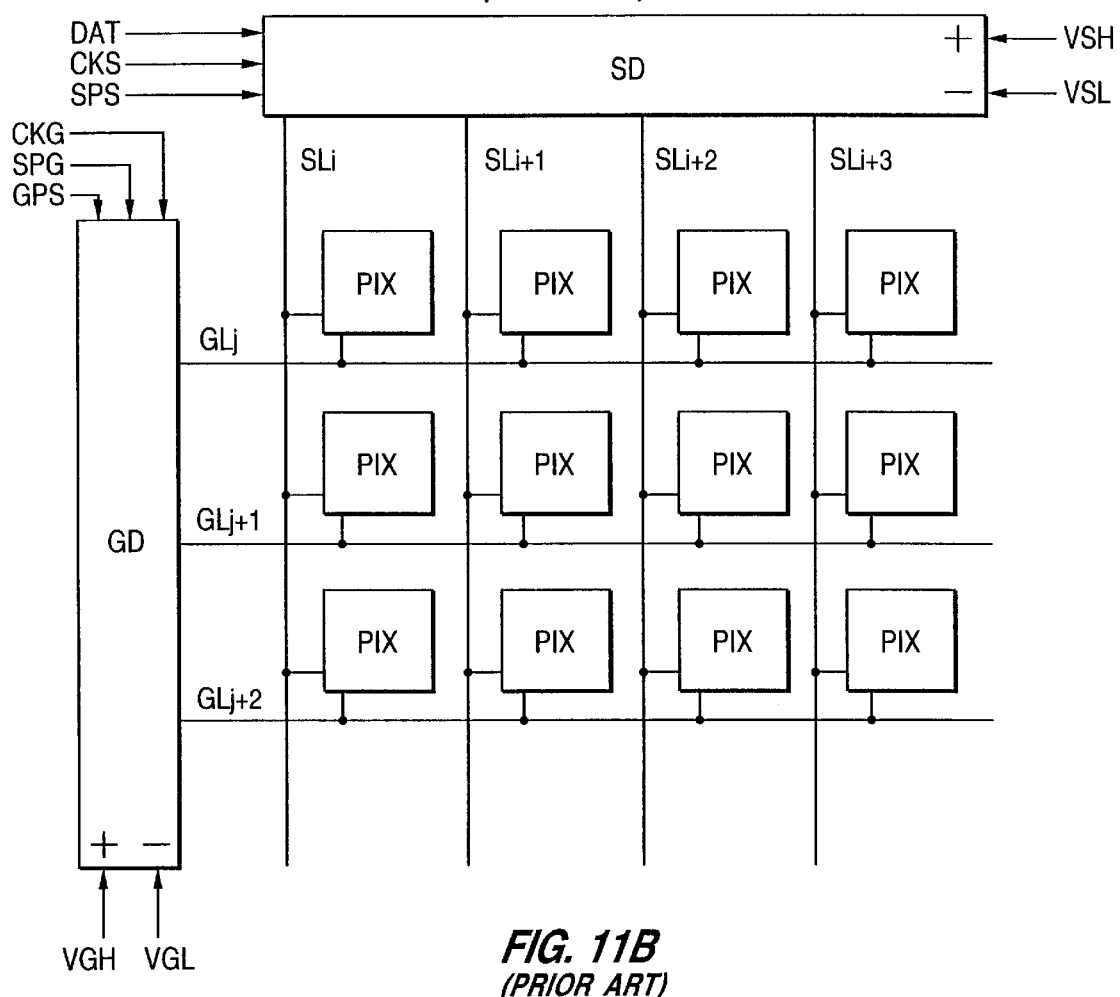
FIG. 11A is a block diagram of a configuration of a conventional image display device.
Figure 11B:
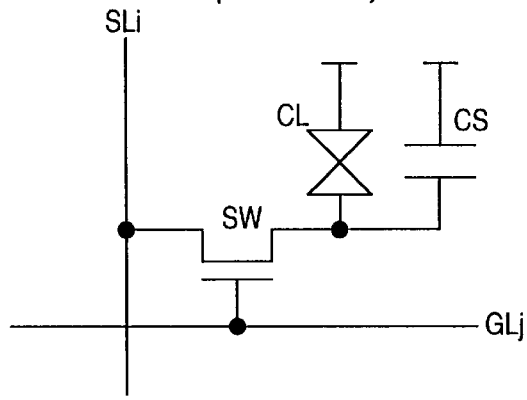
FIG. 11B is a circuit diagram of a pixel of the image display device of FIG. 11A.

FIG. 5 is a block diagram showing a configuration of an image display device of Example 2 according to the present invention. The image display device of this example is different from the conventional image display device shown in FIGS. 11A and 11B in that a data signal line drive circuit SD' of this example includes the sampling circuit of Example 1 according to the present invention.

Figure 6:
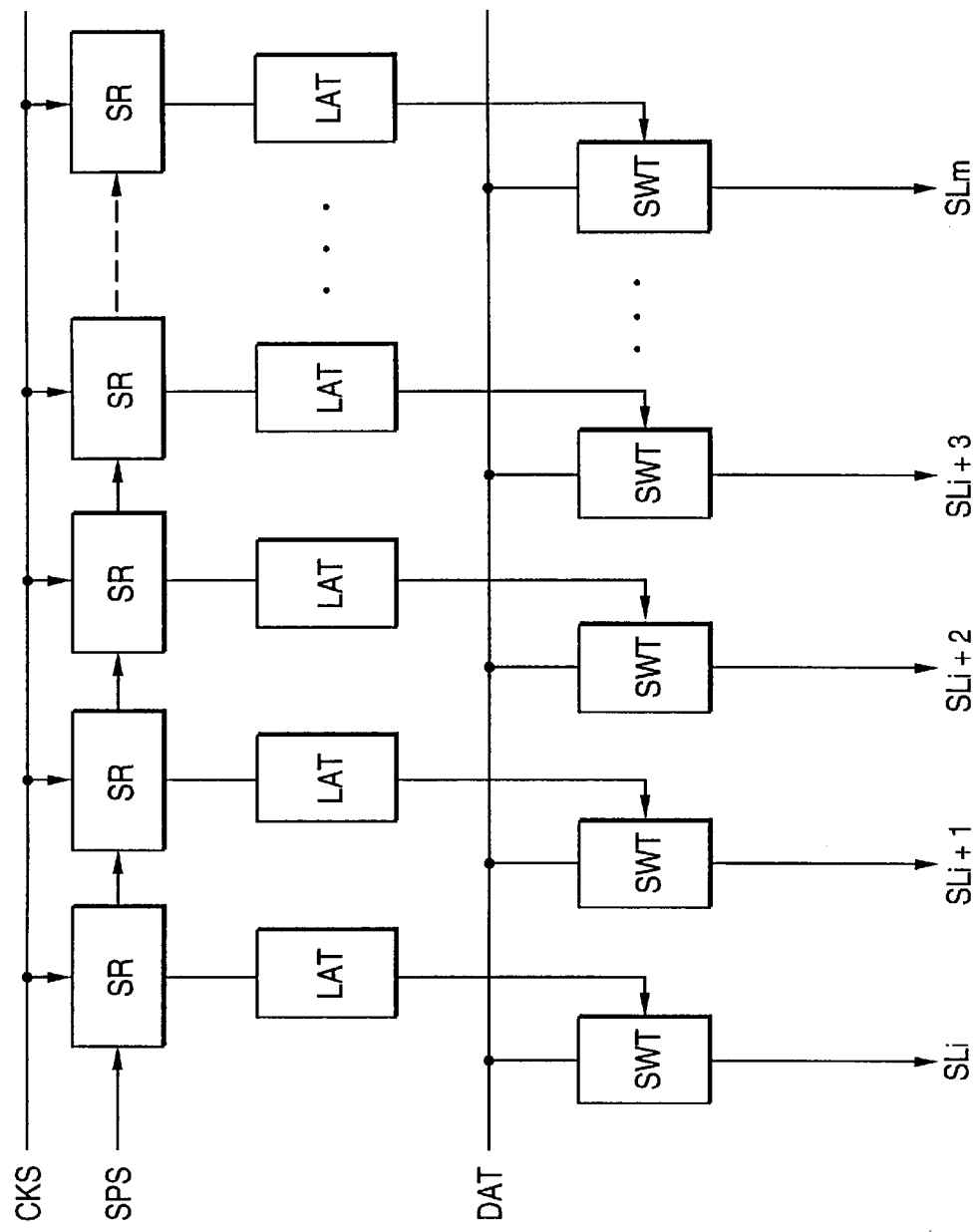
FIG. 6 is a block diagram showing a configuration of a data signal line drive circuit of a point-at-a-time drive method.
Figure 7:
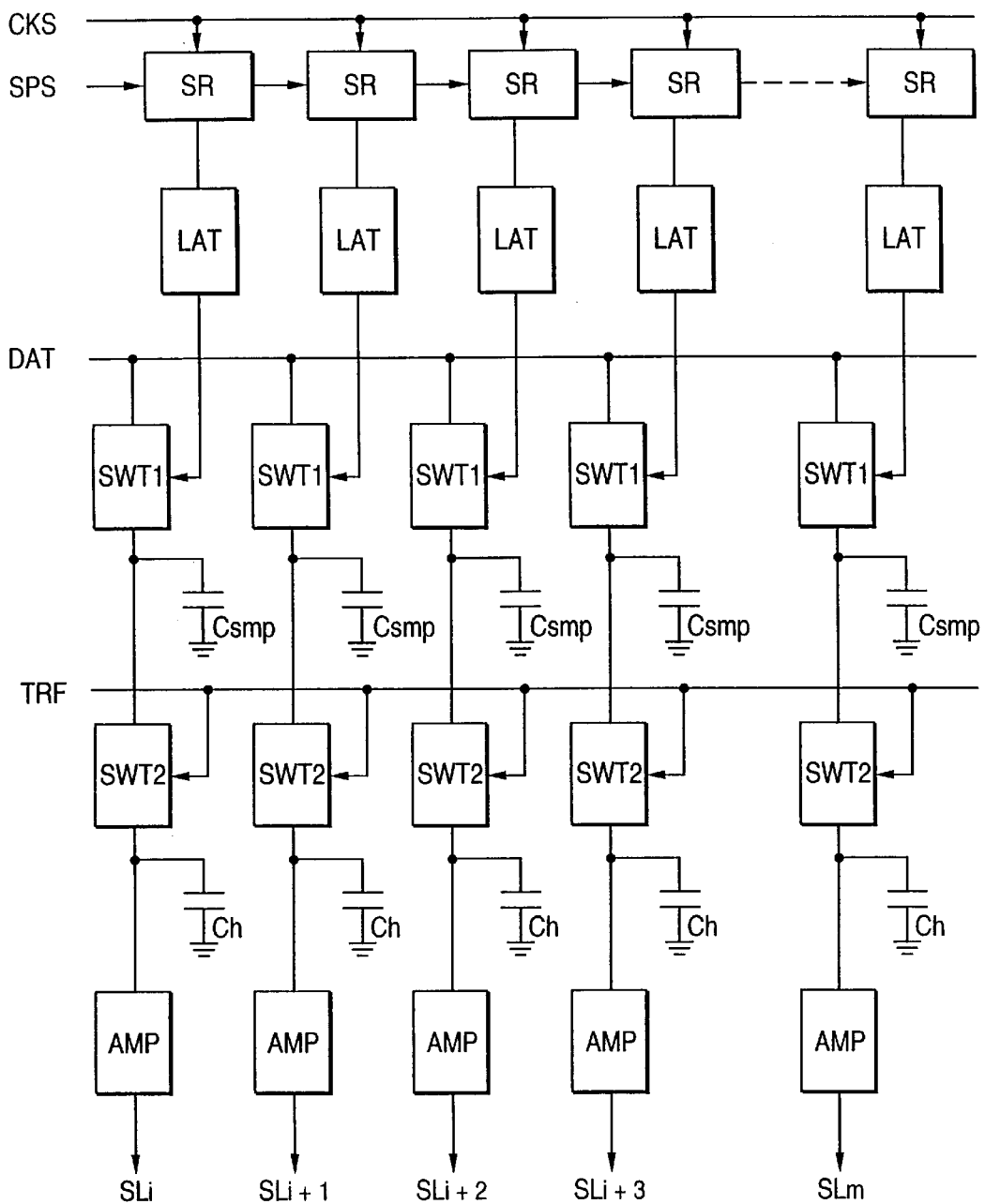
FIG. 7 is a block diagram showing a configuration of a data signal line drive circuit of a line-at-a-time drive method.

The data signal line drive circuit SD' shown in FIG. 5 may be a drive circuit of the point-at-a-time drive method shown in FIG. 6 or the line-at-a-time drive method shown in FIG. 7. The sampling switch SWT' described in Example 1 is used as the sampling switches SWT of the drive circuits of FIGS. 6 and 7.

The data signal line drive circuit SD' is provided with a power terminal VSH and a ground terminal VSL, and is connected with a video signal line DAT, a clock signal line CKS, and a start signal line SPS. A plurality of data signal lines SL are connected to the output terminal of the data signal line drive circuit SD'.

A scan signal line drive circuit GD is provided with a power terminal VGH and a ground terminal VGL, and is connected with a pulse signal line GPS, a clock signal line CKG, and a start signal line SPG. A plurality of scan signal lines GL are connected to the output terminal of the scan signal line drive circuit GD. A pixel PIX is formed near each of the intersections of the data signal lines SL and the scan signal lines GL.

With the above configuration, as in Example 1, the drive power and the feedthrough voltages of the n-channel transistor and the p-channel transistor constituting the sampling switch SWT' are substantially the same. Accordingly, flickering and the like on the resultant display images can be minimized, and thus high quality image display is possible.

In the case of the line-at-a-time drive method shown in FIG. 7, the output of each sampling circuit is not directly supplied to the corresponding data signal line SL, but supplied via a sampling capacitor Csmp and/or a holding capacitor Ch. However, the principle and effect of the present invention are the same in this method as in the point-at-a-time drive method shown in FIG. 6. More specifically, according to the present invention, since the levels of the signal stored in the holding capacitor are symmetric (i.e., the same) on its positive and negative sides, the sampled video signal which has been amplified by the signal amplifier and output to the data signal line as a data signal is also symmetric on its positive and negative sides. Thus, a high quality image display is possible.

When polysilicon TFTs are used, pixel switches and drive circuits can be integrally formed on an insulating substrate, and thus an inexpensive and reliable image display device can be obtained. An example of this configuration is shown in FIG. 8.

Figure 8:
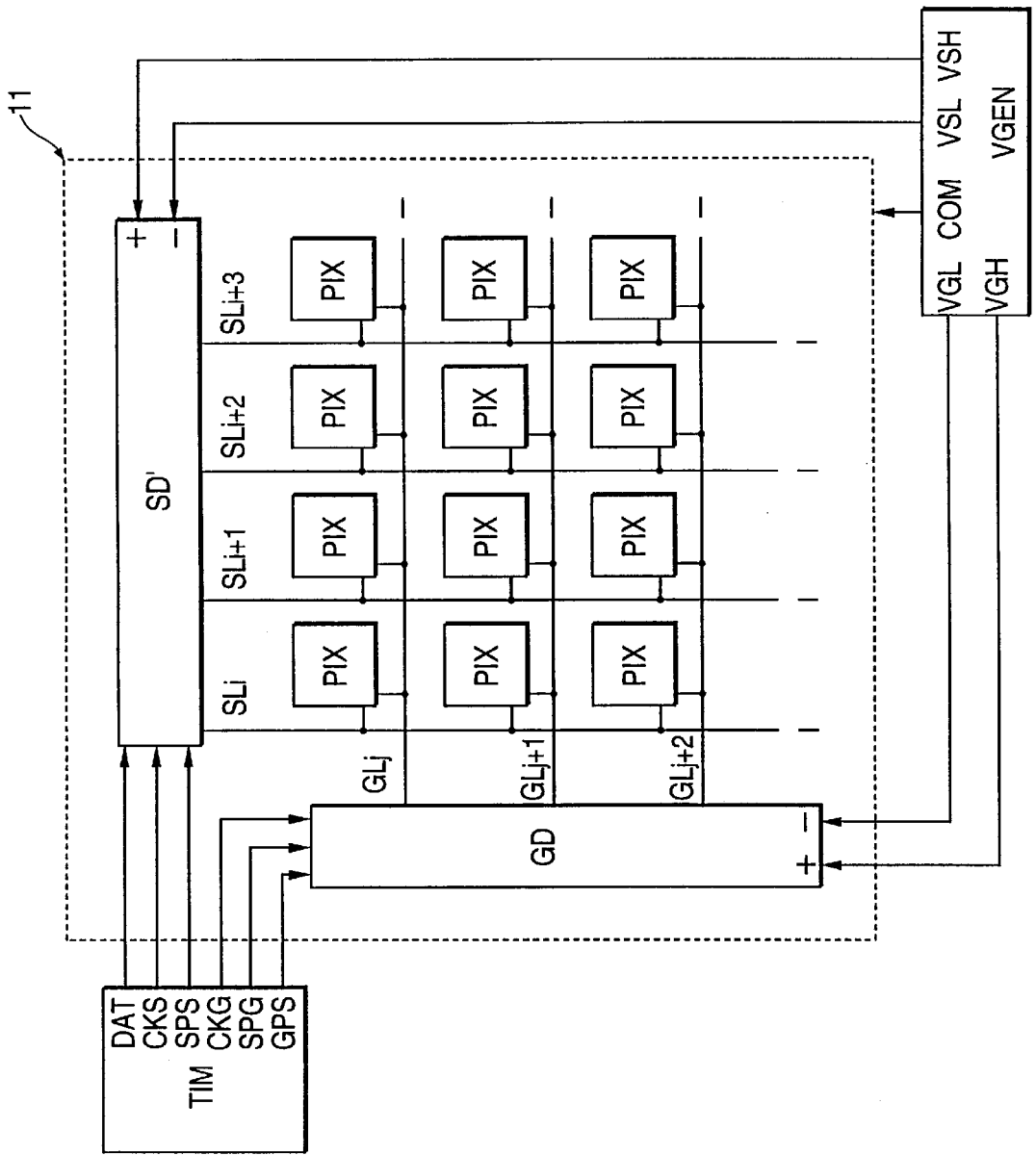
FIG. 8 is a block diagram showing a configuration of the image display device shown in FIG. 5 together with its peripheral circuits.

Referring to FIG. 8, an array of the pixels PIX, the data signal lines SL, the scan signal lines GL, the data signal line drive circuit SD', and the scan signal line drive circuit GD are formed integrally on an insulating substrate 11. A timing signal and a video signal are supplied from an external timing signal generator TIM, while a drive voltage is applied from a power source VGEN. A counter voltage is supplied to the insulating substrate 11 from a terminal COM of the power source VGEN.

With the above configuration, the potential fluctuation at the data signal line due to the channel capacitance increases by using the polysilicon TFTs. In such a case, by using the sampling circuit of Example 1 in the data signal line drive circuit, the adverse effect of the increase of the channel capacitance can be eliminated or greatly reduced and thus a high quality image can be obtained.

Thus, in the above examples, the values of $\mu \times W/L$ and $W \times L$ of the n-channel transistor are made equal to those of the p-channel transistor in the CMOS sampling circuit. As a result, the sampling voltages on the positive side and the negative side are made symmetric with respect to a zero-level. This suppresses flickering and the like on the display, and thus a high quality display can be obtained.

EXAMPLE 3

Figure 9:
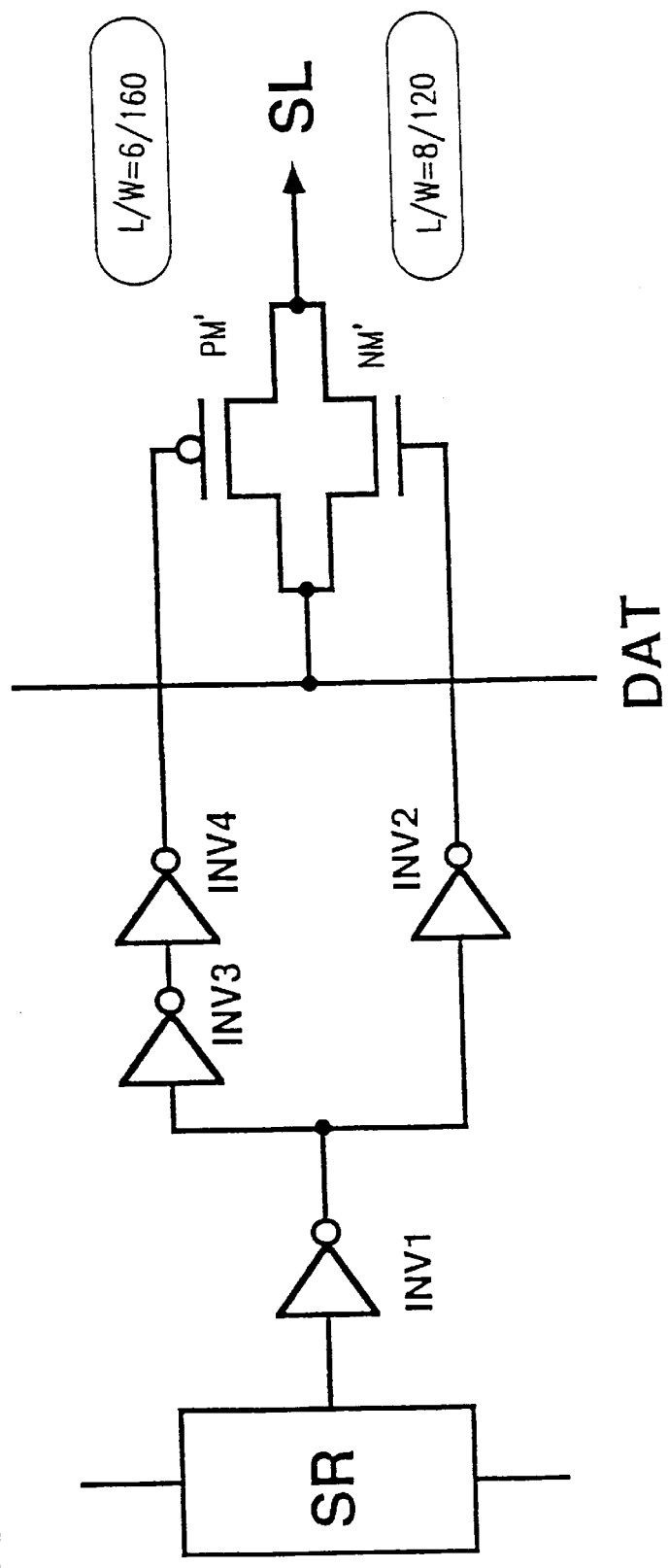
FIG. 9 is a block diagram showing a configuration of a sampling circuit of Example 3 according to the present invention.

FIG. 9 is a block diagram showing a configuration of a sampling circuit of Example 3 according to the present invention.

Referring to FIG. 9, a CMOS sampling circuit is opened/closed with a timing signal output from a shift register SR as a scanning circuit.

More specifically, a signal output from the shift register SR is inverted and amplified by an inverting circuit INV1 and then transmitted through two routes. In one route, the signal is supplied to a gate electrode of an n-channel transistor NM' via an inverting circuit INV2, while in the other route, the signal is supplied to a gate electrode of a p-channel transistor PM' via inverting circuits INV3 and INV4.

In the sampling circuit composed of the n-channel transistor NM' and the p-channel transistor PM', the channel length of the p-channel transistor PM' is made smaller than that of the n-channel transistor NM' as far as no trouble arises with regard to the breakdown voltage of the transistor. As the channel length of the transistor becomes smaller, the breakdown voltage also becomes smaller. It is likely that the transistor having the smaller breakdown voltage will become inoperative if the voltage required for driving it is larger than the breakdown voltage.

More specifically, when a voltage applied between the source and the drain of the transistor reaches the breakdown voltage, a current starts to flow between the source and drain electrodes without applying an ON-voltage to the gate electrode. Thus, the transistor cannot be controlled so as to be turned on or turned off, causing the sampling circuit to become inoperative. In some cases, although the transistor can be controlled so as to be turned on or turned off, the characteristics of the transistor degrade over a long period of time. Therefore, the channel length of the transistor must be determined considering the breakdown voltage and the driving voltage of the resultant transistor.

In general, a p-channel transistor is higher in the breakdown voltage than an n-channel transistor when they have the same channel length. Therefore, in the sampling circuit of this example, the channel length of the p-channel transistor PM' is made smaller than that of the n-channel transistor NM'.

At the same time, the channel areas (product of the channel length and the channel width) of the two transistors are made substantially the same. The reasons are as follows.

The channel areas of the two transistors need to be equal to each other to obtain the feedthrough voltages of substantially the same magnitude irrespective of the polarity of the signal to be sampled. If the device characteristics of the two transistors vary, the channel area needs to be as small as possible to minimize the feedthrough voltage of the sampling signal and the variation thereof.

If the channel lengths of the n-channel transistor and the p-channel transistor are the same as in conventional sampling circuits shown in FIGS. 12 and 13, the device size (channel width) is determined considering the size of the p-channel transistor which has a smaller drive power (smaller carrier mobility) for securing the write performance required for the sampling circuit. As a result, the n-channel transistor has more drive power than is required.

In general, the breakdown voltage (source/drain breakdown voltage) of the p-channel transistor is higher than that of the n-channel transistor of the same size. Accordingly, no operational problem will arise when the channel length of the p-channel transistor is made smaller than that of the n-channel transistor.

Due to the above reasons, in the sampling circuit shown in FIG. 9, the channel length and width of the n-channel transistor are 8 $\mu$m and 120 $\mu$m, respectively, while the channel length and width of the p-channel transistor are 6 $\mu$m and 160 $\mu$m, respectively. This specific example applies to the case where the n-channel transistor with a channel length of 8 μm and the p-channel transistor with a channel length of 6 μm have substantially the same source/drain breakdown voltage.

As a result, the ratio of the channel width to the channel length of the n-channel transistor, i.e., W/L, is about 56% of the ratio of the p-channel transistor. However, since the carrier mobility of the n-channel transistor is about twice that of the p-channel transistor, no problem arises with respect to the drive power.

With the above configuration, since the channel area of each transistor constituting the sampling circuit is small, the feedthrough voltage becomes small. It is expected, therefore, that the asymmetry of the magnitude of the feedthrough voltage on its positive and negative sides occurring when the threshold voltage of each transistor is shifted from the set value, i.e., the difference between the feedthrough voltage obtained when the positive level of a signal is written and that when the negative level of the signal is written, is also reduced.

In order to confirm the above, the write voltages obtained when a video signal (+5 V and −5 V) is sampled and written, i.e., voltages obtained when the sampling circuit is turned off after the data have been written in a sufficient write period, were calculated by a circuit simulation. The results are shown in Table 1 below.

TABLE 1

| 5 V input/−5 V output | $V_{th(n)}$ = 3.0 V/ $V_{th(p)}$ = −3.0 V | $V_{th(n)}$ = 2.5V/ $V_{th(p)}$ = −3.5 V |
|---|---|---|
| Conventional example | | |
| Ln = 8 um Wn = 213 um Lp = 8 um Wp = 213 um | 5.196 V/ −5.195 V | 5.178 V/ −5.211 V |
| Example 3 | | |
| Ln = 8 um Wn = 120 um Lp = 6 um Wp = 160 um | 5.111 V/ −5.110 V | 5.100 V/ −5.120 V |

Table 1 also shows the result of a circuit simulation of the conventional example for comparison. In the conventional example, the n-channel transistor and the p-channel transistor were designed so that they have the same size, i.e., the same channel length and the same channel width and the p-channel transistor has the same drive power as that of the sampling circuit of Example 3 shown in FIG. 9. Therefore, the channel length of each transistor of the conventional example is set at 8 μm, and the channel width of the transistors is set at 213 μm. In Table 1, $L_n$, $W_n$, and $V_{th(n)}$ denote the channel length, the channel width, and the threshold voltage of the n-channel transistor, respectively, while $L_P$, $W_P$, and $V_{th(p)}$ denote the channel length, the channel width, and the threshold voltage of the p-channel transistor, respectively.

As is observed from Table 1, in the case of the sampling circuit of Example 3, the asymmetry of the write voltage obtained when the threshold voltage is shifted by 0.5 V reduces to about 60% of that of the sampling circuit of the conventional example. This percentage is appropriate considering that the channel area of the n-channel transistor is about 56% of the p-channel transistor.

As described above, the n-channel transistor NM' and the p-channel transistor PM' are required to write a signal in the data signal line SL within a predetermined period. A channel width required for this writing is set under the conditions of the thickness of the gate insulating film and the minimum channel length determined based on the process/device technique. Accordingly, when the carrier mobility of the transistor is small, for example, when a polysilicon TFT is used, the channel width needs to be large.

Since the polysilicon TFT is inferior to a single crystalline silicon transistor in the transistor characteristics (carrier mobility, threshold voltage, etc.), the sampling circuit using the polysilicon TFTs needs to be driven with a higher voltage. Moreover, since the source/drain breakdown voltage of the polysilicon TFT is low compared with the single crystalline silicon transistor, the channel length of the polysilicon TFT needs to be larger to secure the breakdown voltage of the same level.

Thus, the channel area of the polysilicon TFT as a transistor constituting the sampling circuit required to obtain a certain level of sampling performance is significantly larger, compared with that of the single crystalline silicon transistor. This increases the asymmetry of the written voltage on the positive and negative levels with high possibility as described above. In such a case, by using the sampling circuit of Example 3, the adverse effect of the increase in the asymmetry of the written voltage, such as flickering, appearance of vertical stripe, or the like, can be eliminated or greatly reduced, and thus a high quality image can be obtained.

The configuration of the polysilicon TFT constituting the sampling circuit of this example can be the same as that shown in FIG. 4.

EXAMPLE 4

Figure 10:
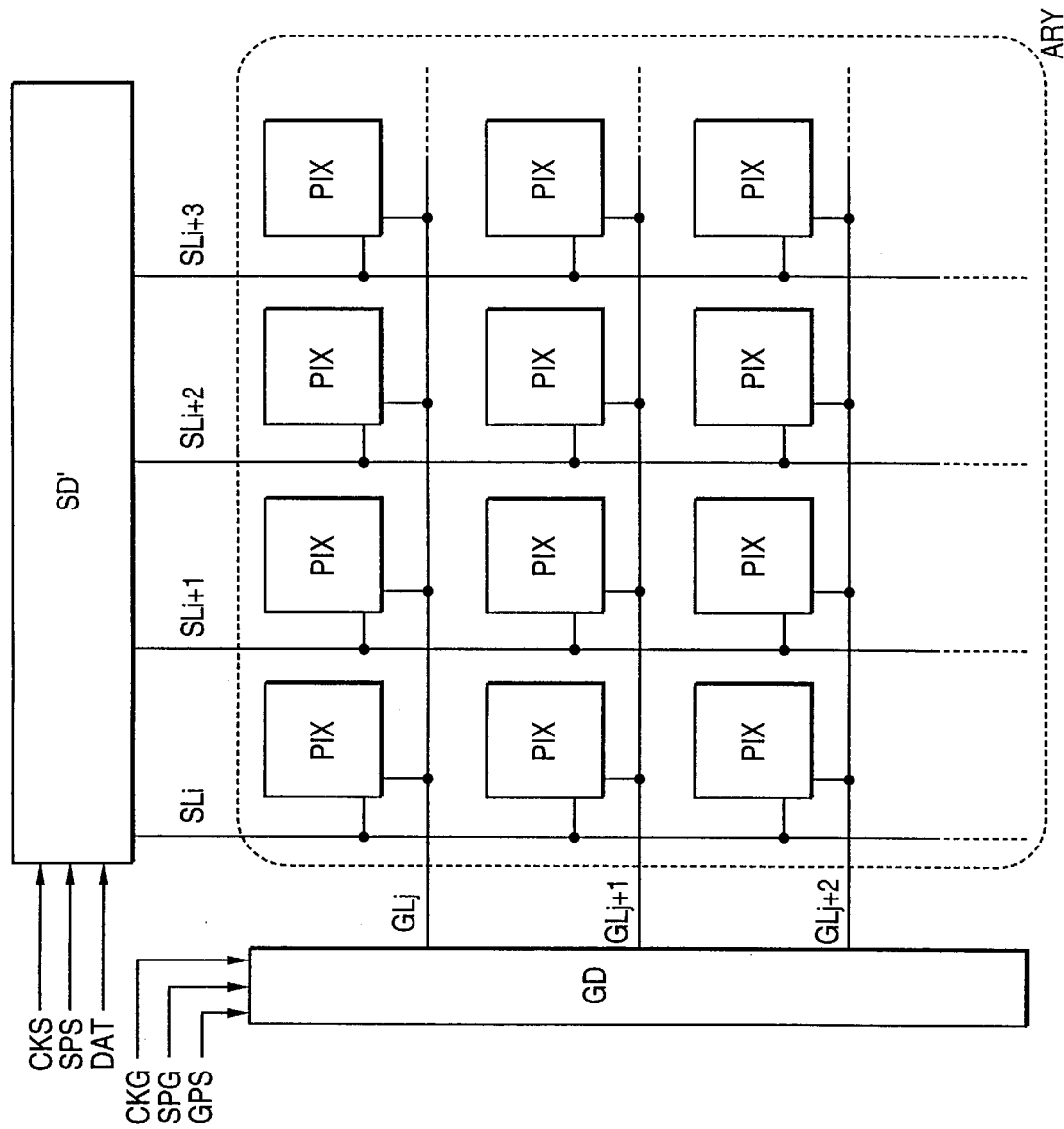
FIG. 10 is a block diagram showing a configuration of an image display device of Example 4 according to the present invention.

FIG. 10 is a block diagram showing a configuration of an image display device of Example 4 according to the present invention.

The image display device of FIG. 10 is different from the conventional image display device in that a data signal line drive circuit SD' of this example includes the sampling circuit of Example 3 according to the present invention.

The data signal line drive circuit SD' shown in FIG. 10 may be a drive circuit of the point-at-a-time drive method shown in FIG. 6 or a drive circuit of the line-at-a-time drive method shown in FIG. 7. The sampling switch SWT' described in Example 3 is used as sampling switches SWT of the drive circuits of FIGS. 6 and 7.

With the above configuration, as in Example 3, the feedthrough voltages of the n-channel transistor and the p-channel transistor constituting the sampling switch are small. Accordingly, the asymmetry of the written voltages can be minimized even when the threshold of the transistors varies. As a result, flickering, vertical stripes, and the like on the resultant display images can be minimized, and thus a high quality image display is possible.

In the case of the line-at-a-time drive method shown in FIG. 7, the output of each sampling circuit is not directly supplied to the corresponding data signal line SL, but supplied via a sampling capacitor Csmp and/or a holding capacitor Ch. However, the principle and effect of the present invention are the same in this method as in the point-at-a-time drive method shown in FIG. 6.

When polysilicon TFTs are used, pixel switches and drive circuits can be integrally formed on an insulating substrate, and thus an inexpensive and reliable image display device can be obtained, as shown in FIG. 8. However, in such an image display device, the potential fluctuation at the data signal line due to the channel capacitance (the feedthrough voltage and the variation thereof) increases by using the polysilicon TFTS. By using the sampling circuit of Example 3 in the data signal line drive circuit, the adverse effect of the potential fluctuation, such as flickering or the like, can be eliminated or greatly reduced, realizing a high quality display image.

Thus, according to the present invention, the drive power of the n-channel transistor and the p-channel transistor which are connected in parallel to constitute the sampling circuit, are made substantially the same. Also, the feedthrough voltages caused by the channel capacitances of the n-channel transistor and the p-channel transistor are made substantially the same. With these settings, the positive and negative levels of the signal output from the sampling circuit at the completion of data writing can be symmetric.

Alternatively, the channel length of the p-channel transistor is made smaller than that of the n-channel transistor, and the channel areas of the n-channel transistor and the p-channel transistor are made substantially the same. With these settings, the asymmetry of the positive and negative levels of the signal at the completion of data writing can be minimized even when the characteristics of the sampling transistors vary.

In particular, the present invention is more advantageous in the case where the sampling circuit is composed of elements with a small carrier mobility and a large size, such as polysilicon TFTs. This is because the channel capacitance of such an element is large and the influence of the feedthrough voltage increases.

In the image display device according to the present invention, when the sampling circuit of the present invention is used in the data signal line drive circuit for writing a video signal in the data signal lines, the positive and negative levels of the signal which is sampled and then written are symmetric in the display by the polarity inversion drive method. As a result, a high quality image display without flickering can be realized.

When the image display device is fabricated by forming at least the pixels and the data signal line drive circuit integrally on an insulating substrate using a polysilicon thin film formed on the substrate, the cost for mounting the drive circuits can be reduced, while a high quality image display can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A sampling circuit for sampling an analog signal in accordance with a timing signal, the sampling circuit including a sampling switching element having a CMOS configuration, the sampling switching element comprising:

an n-channel transistor and an p-channel transistor connected in parallel, a drive power and feedthrough voltage being substantially the same in the n-channel transistor and the p-channel transistor, wherein values of $\mu \times W/L$ and $W \times L$ of the n-channel transistor are substantially equal to those of the p-channel transistor, where $\mu$, W and L are mobility, a channel width and a channel length, respectively.

2. A sampling circuit for sampling an analog signal in accordance with a timing signal, the sampling circuit including a sampling switching element having a CMOS configuration, the sampling switching element comprising: an n-channel transistor and a p-channel transistor connected in parallel, wherein values of $\mu \times W/L$ and $W \times L$ of the n-channel transistor are substantially equal to those of the p-channel transistor, where $\mu$, W and L are mobility, a channel width and a channel length, respectively.

3. A sampling circuit for sampling an analog signal in accordance with a timing signal, the sampling circuit including a sampling switching element having a CMOS configuration, the sampling switching element comprising: an n-channel transistor and a p-channel transistor connected in parallel, wherein a channel length of the p-channel transistor is smaller than that of the n-channel transistor, and the product of the channel length and a channel width of the p-channel transistor is substantially equal to that of the n-channel transistor.

4. A sampling circuit according to claim 1, wherein each of the n-channel transistor and the p-channel transistor includes a polysilicon thin film transistor.

5. A sampling circuit according to claim 2, wherein each of the n-channel transistor and the p-channel transistor includes a polysilicon thin film transistor.

6. A sampling circuit according to claim 3, wherein each of the n-channel transistor and the p-channel transistor includes a polysilicon thin film transistor.

7. An image display device comprising:

an array of pixels arranged in a matrix;

data signal lines each disposed adjacent to a corresponding column of the pixels, each of the data signal lines supplying data signals to the pixels of the corresponding column;

a data signal drive circuit for sampling a video signal in accordance with a timing signal and writing the sampled video signal as the data signals in the data signal lines, the data signal drive circuit includes a sampling circuit, the sampling circuit includes a sampling switching element having a CMOS configuration, the sampling switching element including an n-channel transistor and a p-channel transistor connected in parallel, a drive power and a feedthrough voltage being substantially the same in the n-channel transistor and the p-channel transistor, wherein values of $\mu \times W/L$ and $W \times L$ of the n-channel transistor are substantially equal to those of the p-channel transistor, where $\mu$, W and L are mobility, a channel width and a channel length, respectively.

8. An image display device according to claim 7, wherein polysilicon thin film transistors are provided in the array of the pixels for connecting the data signal lines to the pixels of the respective columns, and wherein at least the array of the pixels and the data signal drive circuit are formed on an insulating substrate.

9. An image display device comprising:

an array of pixels arranged in matrix;

data signal lines each disposed adjacent to a corresponding column of the pixels, each of the data signal lines supplying data signals to the pixels of the corresponding column;

a data signal drive circuit for sampling a video signal in accordance with a timing signal and writing the sampled video signal as the data signals in the data signal lines, the data signal drive circuit including a sampling circuit, wherein the sampling circuit includes a sampling switching element having a CMOS configuration, the sampling switching element including an n-channel transistor and a p-channel transistor connected in parallel, values of $\mu \times W/L$ and $W \times L$ of the n-channel transistor being substantially equal to those of the p-channel transistor, where $\mu$, W and L are mobility, a channel width and a channel length, respectively.

10. An image display device according to claim 9, wherein polysilicon thin film transistors are provided in the array of the pixels for connecting the data signal lines to the pixels of the respective columns, and wherein at least the array of the pixels and the data signal drive circuit are formed on an insulating substrate.

11. An image display device comprising:

an array of pixels arranged in a matrix;

data signal lines each disposed adjacent to a corresponding column of the pixels, each of the data signal lines supplying data signals to the pixels of the corresponding column;

a data signal drive circuit for sampling a video signal in accordance with a timing signal and writing the sampled video signal as the data signals in the data signal lines, the data signal drive circuit including a sampling circuit, wherein the sampling circuit includes a sampling switching element having a CMOS configuration, the sampling switching element including an n-channel transistor and a p-channel transistor connected in parallel, a channel length of the p-channel transistor being smaller than that of the n-channel transistor, the product of the channel length and a channel width of the p-channel transistor being substantially equal to that of the n-channel transistor.

12. An image display device according to claim 11, wherein polysilicon thin film transistors are provided in the array of the pixels for connecting the data signal lines to the pixels of the respective columns, and wherein at least the array of the pixels and the data signal drive circuit are formed on an insulating substrate.

* * * * *